(12) United States Patent
Omura (10) Patent No.: US 12,143,097 B2
(45) Date of Patent: Nov. 12, 2024

(54) ACOUSTIC WAVE FILTER DEVICE (71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 53 days.

(21) Appl. No.: 16/817,680

(22) Filed: Mar. 13, 2020

(65) Prior Publication Data

US 2020/0212889 A1 Jul. 2, 2020

Related U.S. Application Data

(63) Continuation of application No. PCT/JP2018/035553, filed on Sep. 26, 2018.

(30) Foreign Application Priority Data

Sep. 27, 2017 (JP) ................. 2017-186735

(51) Int. Cl.
*H03H 9/64* (2006.01)
*H03H 9/02* (2006.01)
(Continued)

(52) U.S. Cl.
CPC ...... *H03H 9/6489* (2013.01); *H03H 9/02559* (2013.01); *H03H 9/02866* (2013.01);
(Continued)

(58) Field of Classification Search
CPC ........... H03H 9/6489; H03H 9/022559; H03H 9/02866; H03H 9/02992; H03H 9/145; H03H 9/25; H03H 9/6483
See application file for complete search history.

(56) References Cited

U.S. PATENT DOCUMENTS

2007/0096851 A1* 5/2007 Uno ................. H03H 9/175
333/191
2008/0297279 A1* 12/2008 Thalhammer ........ H03H 9/0095
29/25.35

(Continued)

FOREIGN PATENT DOCUMENTS

CN 1960177 A 5/2007
CN 103891139 A 6/2014
(Continued)

OTHER PUBLICATIONS

Official Communication issued in International Patent Application No. PCT/JP2018/035553, mailed on Dec. 4, 2018.
(Continued)

*Primary Examiner* — Samuel S Outten
(74) *Attorney, Agent, or Firm* — Keating & Bennett, LLP (57) ABSTRACT

An acoustic wave filter device includes a substrate, first and second acoustic impedance layers, a piezoelectric layer, first and second interdigital transducer electrodes, an input terminal, an output terminal, ground terminals, a series arm circuit, and a parallel arm circuits. The first interdigital transducer electrode at least partially overlaps the first acoustic impedance layer in the plan view. The second interdigital transducer electrode at least partially overlaps the second acoustic impedance layer in the plan view. The series arm circuit is provided on a first path connecting the input terminal and the output terminal and includes the first and second interdigital transducer electrodes. A conductive layer in the first acoustic impedance layer and a conductive layer in the second acoustic impedance layer are electrically insulated from each other.

13 Claims, 8 Drawing Sheets

(51) Int. Cl.
*H03H 9/145* (2006.01)
*H03H 9/25* (2006.01)

(52) U.S. Cl.
CPC ........ *H03H 9/02992* (2013.01); *H03H 9/145* (2013.01); *H03H 9/25* (2013.01); *H03H 9/6483* (2013.01)

(56) References Cited

U.S. PATENT DOCUMENTS

| | | | |
|---|---|---|---|
| 2008/0297280 A1* | 12/2008 | Thalhammer | H03H 9/605 |
| | | | 29/25.35 |
| 2014/0152146 A1 | 6/2014 | Kimura et al. | |
| 2014/0225684 A1* | 8/2014 | Kando | H03H 9/14594 |
| | | | 333/195 |
| 2017/0187352 A1 | 6/2017 | Omura | |
| 2017/0366163 A1 | 12/2017 | Kishimoto | |
| 2018/0091116 A1 | 3/2018 | Kai | |
| 2019/0140613 A1* | 5/2019 | Kawaguchi | H03H 9/725 |

FOREIGN PATENT DOCUMENTS

| | | |
|---|---|---|
| WO | 2012/086441 A1 | 6/2012 |
| WO | 2016/052129 A1 | 4/2016 |
| WO | 2016/147986 A1 | 9/2016 |
| WO | 2016/208427 A1 | 12/2016 |

OTHER PUBLICATIONS

First Office Action in CN201880062735.3, mailed Jan. 19, 2023, 6 pages.

\* cited by examiner

ACOUSTIC WAVE FILTER DEVICE

CROSS REFERENCE TO RELATED APPLICATIONS

This application claims the benefit of priority to Japanese Patent Application No. 2017-186735 filed on Sep. 27, 2017 and is a Continuation Application of PCT Application No. PCT/JP2018/035553 filed on Sep. 26, 2018. The entire contents of each application are hereby incorporated herein by reference.

BACKGROUND OF THE INVENTION

1. Field of the Invention

The present invention relates to acoustic wave filter devices, and more specifically, to an acoustic wave filter device including a piezoelectric layer.

2. Description of the Related Art

In general, as acoustic wave devices for use in resonators, band filters (acoustic wave filter devices), and the like, acoustic wave devices using plate waves are known (for example, refer to International Publication No. 2012/086441).

The acoustic wave device described in the International Publication No. 2012/086441 includes a support substrate, an acoustic reflection layer (acoustic impedance layer), a piezoelectric layer, and an interdigital transducer electrode.

The acoustic reflection layer of the acoustic wave device described in the International Publication No. 2012/086441 includes a low acoustic impedance layer and a high acoustic impedance layer whose acoustic impedance is higher than that of the low acoustic impedance layer.

The International Publication No. 2012/086441 describes that plate waves can be effectively reflected by increasing the acoustic impedance ratio that is a ratio of the acoustic impedance of the high acoustic impedance layer to the acoustic impedance of the low acoustic impedance layer, and thus, excellent filter characteristics can be obtained. Further, the International Publication No. 2012/086441 discloses a combination of tungsten (W) and silicon oxide (SiO$_2$) as the combination of materials that gives the maximum acoustic impedance ratio.

However, in the acoustic wave filter device including an acoustic reflection layer (acoustic impedance layer), in the case where a metal such as W or the like is used as the material of the acoustic reflection layer, there is an issue of out-of-band attenuation degradation.

SUMMARY OF THE INVENTION

Preferred embodiments of the present invention provide acoustic wave filter devices that each reduce or prevent degradation of attenuation.

An acoustic wave filter device according to a preferred embodiment of the present invention includes a substrate, a first acoustic impedance layer, a second acoustic impedance layer, a piezoelectric layer, a first interdigital transducer electrode, a second interdigital transducer electrode, an input terminal, an output terminal, a ground terminal, a series arm circuit, and a parallel arm circuit. The first acoustic impedance layer and the second acoustic impedance layer are provided on the substrate. The piezoelectric layer is provided on the first acoustic impedance layer and the second acoustic impedance layer. The first interdigital transducer electrode is provided on the piezoelectric layer and at least partially overlaps the first acoustic impedance layer in the plan view from the thickness direction of the piezoelectric layer. The second interdigital transducer electrode is provided on the piezoelectric layer and at least partially overlaps the second acoustic impedance layer in the plan view from the thickness direction. The input terminal is provided on the piezoelectric layer. The output terminal is provided on the piezoelectric layer. The ground terminal is provided on the piezoelectric layer. The series arm circuit is provided on a first path connecting the input terminal and the output terminal and includes the first interdigital transducer electrode and the second interdigital transducer electrode. The parallel arm circuit is provided on a second path connecting a node on the first path and the ground terminal. Each of the first acoustic impedance layer and the second acoustic impedance layer includes at least one high acoustic impedance layer and at least one low acoustic impedance layer whose acoustic impedance is lower than that of the at least one high acoustic impedance layer. In each of the first acoustic impedance layer and the second acoustic impedance layer, at least one of the at least one high acoustic impedance layer and the at least one low acoustic impedance layer is a conductive layer. The conductive layer in the first acoustic impedance layer and the conductive layer in the second acoustic impedance layer are electrically insulated from each other.

Acoustic wave filter devices according to preferred embodiments of the present invention reduce or prevent degradation of attenuation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Acoustic wave filter devices according to preferred embodiments are described with reference to the drawings.

FIGS. 1 to 8B to be referred in the following preferred embodiments and the like are all schematic diagrams, and each ratio of sizes or thicknesses of elements in the drawings does not necessarily reflect the actual dimension ratio.

Preferred Embodiment 1

(1) Overall Configuration of Acoustic Wave Filter Device

Next, an acoustic wave filter device 1 according to a preferred embodiment 1 of the present invention is described with reference to the drawings.

Figure 1:
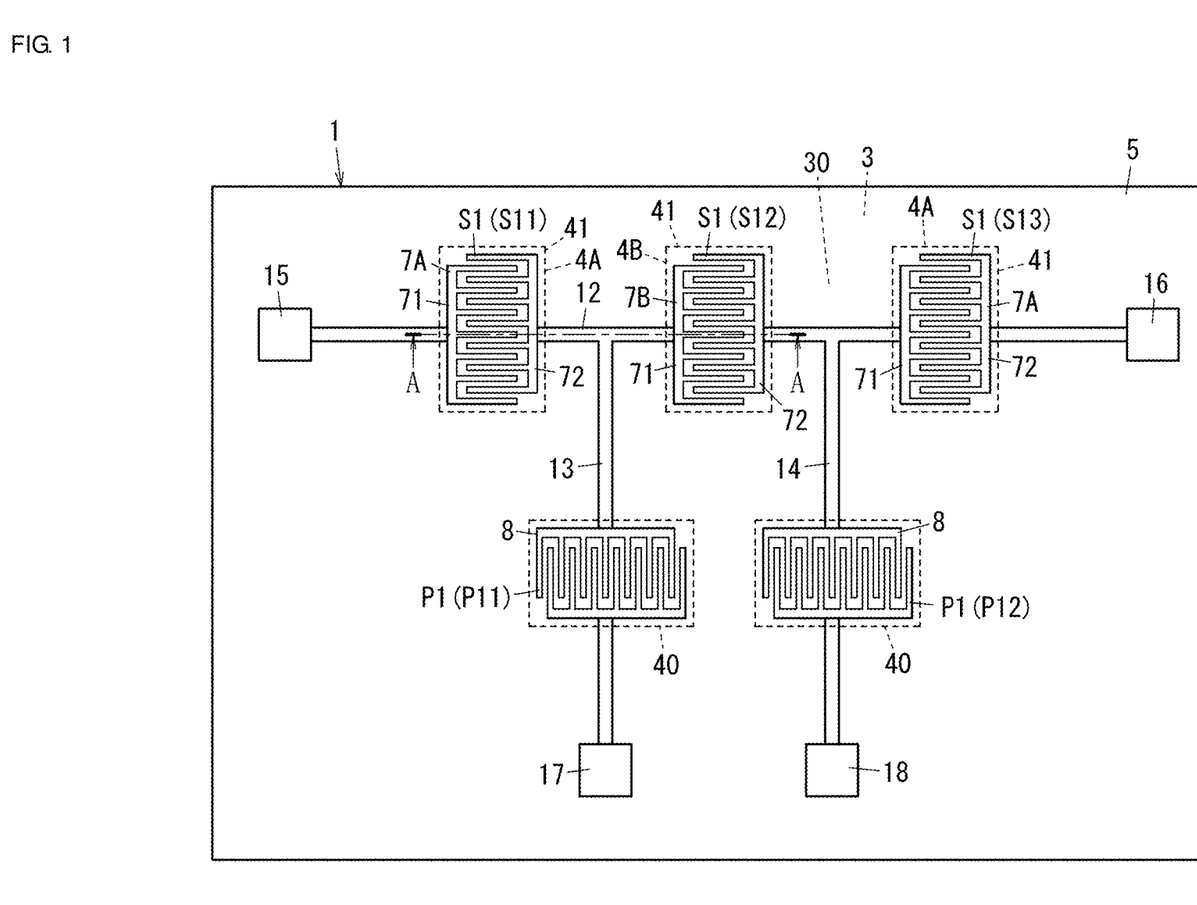
FIG. 1 is a plan view of an acoustic wave filter device according to a preferred embodiment 1 of the present invention.
Figure 4:
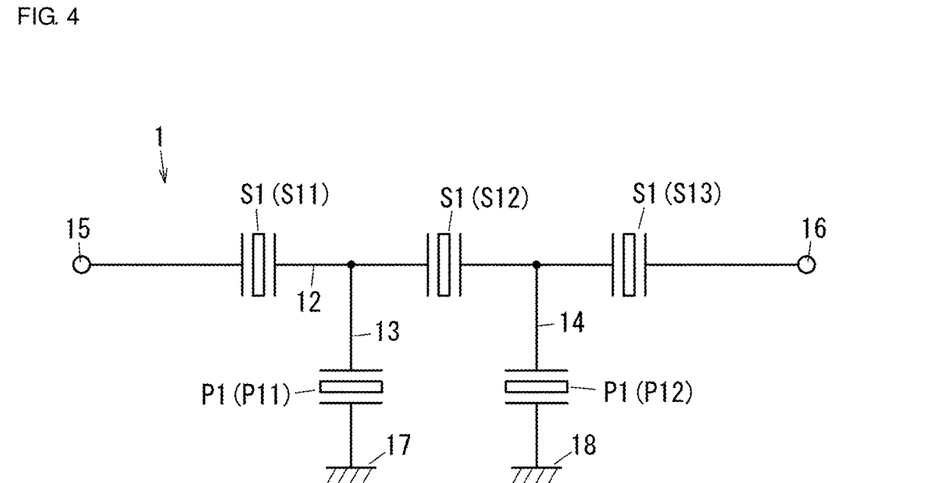
FIG. 4 is a circuit diagram of the acoustic wave filter device according to the preferred embodiment 1 of the present invention.
Figure 5:
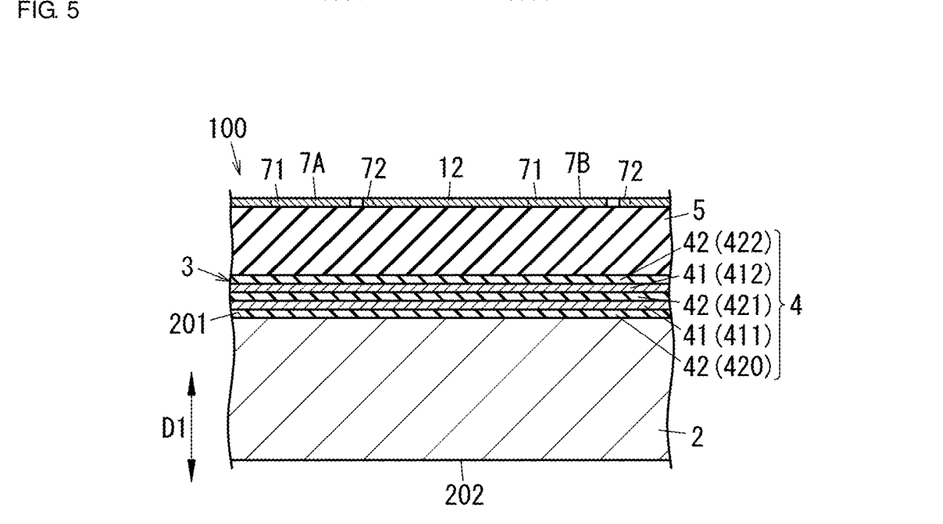
FIG. 5 is a relevant portion cross-sectional view of an acoustic wave filter device of a comparison example.

The acoustic wave filter device 1 according to the preferred embodiment 1 is a ladder filter. As illustrated in FIG. 1 and FIG. 4, the acoustic wave filter device 1 includes an input terminal 15, an output terminal 16, a plurality (for example, two) of ground terminals 17 and 18, a series arm circuit 12, and a plurality of parallel arm circuits 13 and 14. The series arm circuit 12 is provided on a first path connecting the input terminal 15 and the output terminal 16. The two parallel arm circuits 13 and 14 are respectively provided on two second paths connecting nodes on the first path and the two ground terminals 17 and 18 in one-to-one manner, respectively. The series arm circuit includes a plurality (for example, three) of series arm resonators S1. Each of the two parallel arm circuits 13 and 14 includes a parallel arm resonator P1.

In the acoustic wave filter device 1, the plurality of series arm resonators S1 are connected in series to each other. In the following, for the sake of explanation, the three series arm resonators S1 may also be referred to as a series arm resonator S11, a series arm resonator S12, and a series arm resonator S13 from the side closest to the input terminal 15. Further, the two parallel arm resonators P1 may be referred to as a parallel arm resonator P11 and a parallel arm resonator P12 from the side closest to the input terminal 15. One end portion of the parallel arm resonator P11 is connected to a connection point (a node on the first path) of two of the series arm resonators S11 and S12. The other end portion of the parallel arm resonator P11 is connected to the ground terminal 17. One end portion of the parallel arm resonator P12 is connected to a connection point (a node on the first path) of two of the series arm resonators S12 and S13. The other end portion of the parallel arm resonator P12 is connected to the ground terminal 18.

Figure 2:
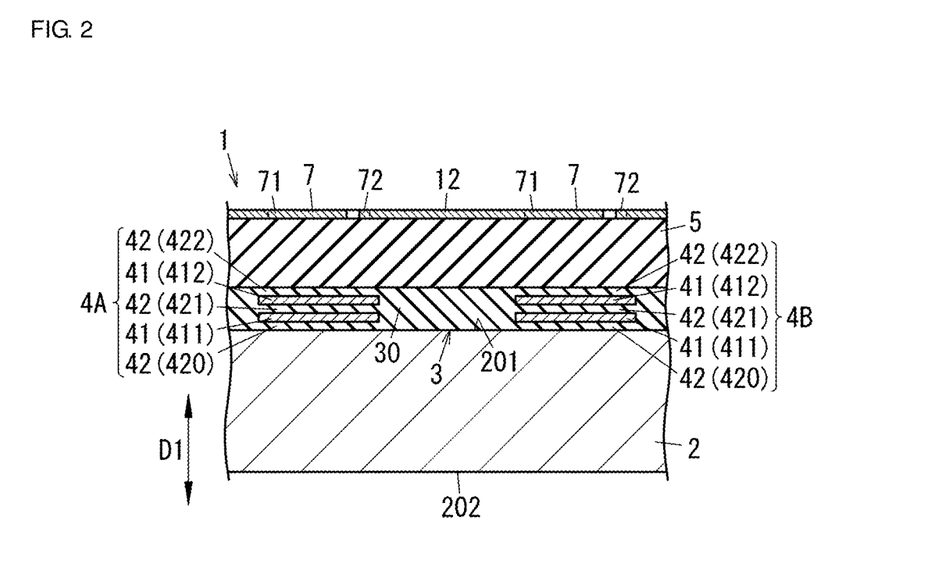
FIG. 2 is a cross-sectional view along the line A-A of FIG. 1.

Specifically, as illustrated in FIG. 1 and FIG. 2, the acoustic wave filter device 1 includes a substrate 2, a first acoustic impedance layer 4A, a second acoustic impedance layer 4B, a piezoelectric layer 5, the input terminal 15, the output terminal 16, the plurality (for example, two) of ground terminals 17 and 18, a first interdigital transducer electrode 7A, a second interdigital transducer electrode 7B, and a plurality (for example, two) of third interdigital transducer electrodes 8. The first acoustic impedance layer 4A and the second acoustic impedance layer 4B are provided on the substrate 2. The piezoelectric layer 5 is provided on the first acoustic impedance layer 4A and the second acoustic impedance layer 4B. The input terminal 15 is provided on the piezoelectric layer 5. The output terminal 16 is provided on the piezoelectric layer 5. The plurality of ground terminals 17 and 18 are provided on the piezoelectric layer 5. The first interdigital transducer electrode 7A and the second interdigital transducer electrode 7B are provided on the piezoelectric layer 5. The first interdigital transducer electrode 7A and the second interdigital transducer electrode 7B are interdigital transducer electrodes of the plurality of series arm resonators S1 provided on the first path connecting the input terminal 15 and the output terminal 16. The plurality of third interdigital transducer electrodes 8 are provided on the piezoelectric layer 5. The plurality of third interdigital transducer electrodes 8 are interdigital transducer electrodes of the plurality of parallel arm resonators P1 provided on the plurality of second paths connecting the plurality of ground terminals 17 and 18 and the nodes on the first path, respectively.

(2) Elements of Acoustic Wave Filter Device

Next, each element of the acoustic wave filter device 1 is described with reference to the drawings.

(2.1) Substrate

As illustrated in FIG. 2, the substrate 2 supports a multilayer body including the first acoustic impedance layer 4A, the second acoustic impedance layer 4B, the piezoelectric layer 5, the first interdigital transducer electrode 7A, the second interdigital transducer electrode 7B, and the plurality of third interdigital transducer electrodes 8. In the following, of the multilayer body, a layer including the first acoustic impedance layer 4A and the second acoustic impedance layer 4B and being interposed between the substrate 2 and the piezoelectric layer 5 is referred to as an intermediate layer 3. The substrate 2 includes a first principal surface 201 and a second principal surface 202, which are opposite to each other in the thickness direction D1 of the substrate 2. The first principal surface 201 and the second principal surface 202 face away from each other. In plan view, the substrate 2 (the circumferential shape when the substrate 2 is viewed from the thickness direction D1) preferably has a rectangular or substantially rectangular shape, for example. However, the shape is not limited to a rectangular or substantially rectangular shape and may be, for example, a square or substantially square shape. The substrate 2 is preferably, for example, a silicon substrate. The thickness of the substrate 2 is preferably, for example, about 120 μm.

(2.2) First Acoustic Impedance Layer and Second Acoustic Impedance Layer

As illustrated in FIG. 2, the first acoustic impedance layer 4A and the second acoustic impedance layer 4B are provided on the first principal surface 201 of the substrate 2. The first acoustic impedance layer 4A is disposed opposite the first interdigital transducer electrode 7A in the thickness direction D1 of the substrate 2. The second acoustic impedance layer 4B is disposed opposite the second interdigital transducer electrode 7B in the thickness direction D1 of the substrate 2. Further, the plurality of third acoustic impedance layers 40 are disposed opposite the plurality (two) of third interdigital transducer electrodes 8 in the thickness direction D1 of the substrate 2. Further, the acoustic wave filter device 1 further includes an insulation layer 30 interposed between the first acoustic impedance layer 4A and the second acoustic impedance layer 4B on the substrate 2. The insulation layer 30 is provided on the substrate 2. The insulation layer 30 is included in the foregoing multilayer body. The first acoustic impedance layer 4A, the second acoustic impedance layer 4B, the plurality of the third acoustic impedance layers 40, and the insulation layer 30 are interposed between the substrate 2 and the piezoelectric layer 5. In the acoustic wave filter device 1, the series arm resonators S11 and include the first interdigital transducer electrode 7A, the first acoustic impedance layer 4A disposed opposite the first interdigital transducer electrode 7A, and a portion of the piezoelectric layer 5 between the first interdigital transducer electrode 7A and the first acoustic impedance layer 4A. Further, the series arm resonators S12 includes the second interdigital transducer electrode 7B, the second acoustic impedance layer 4B disposed opposite the second interdigital transducer electrode 7B, and a portion of the piezoelectric layer 5 between the second interdigital transducer electrode 7B and the second acoustic impedance layer 4B. The parallel arm resonators P11 and P12 each include the third interdigital transducer electrode 8, the third acoustic impedance layer 40 disposed opposite the third interdigital transducer electrode 8, and a portion of the piezoelectric layer 5 between the third interdigital transducer electrode 8 and the third acoustic impedance layer 40.

The first acoustic impedance layer 4A reduces or prevents acoustic waves excited at the first interdigital transducer electrode 7A from leaking to the substrate 2. The second acoustic impedance layer 4B reduces or prevents acoustic waves excited at the second interdigital transducer electrode 7B from leaking to the substrate 2. Each of the first acoustic impedance layer 4A and the second acoustic impedance layer 4B has a multilayer structure including a plurality (for example, three) of low acoustic impedance layers 42 and a plurality (for example, two) of high acoustic impedance layers 41 that are stacked layer by layer in an alternating fashion in the thickness direction D1. The acoustic impedance of the low acoustic impedance layer 42 is lower than the acoustic impedance of the high acoustic impedance layer 41.

In the following, for the sake of explanation, in each of the first acoustic impedance layer 4A and the second acoustic impedance layer 4B, the two high acoustic impedance layers 41 may also be referred to as a high acoustic impedance layer 411 and a high acoustic impedance layer 412 from the side closest to the first principal surface 201 of the substrate 2. Further, the three low acoustic impedance layers 42 may be referred to as a low acoustic impedance layer 420, a low acoustic impedance layer 421, and a low acoustic impedance layer 422 from the side closest to the first principal surface 201 of the substrate 2.

In each of the first acoustic impedance layer 4A and the second acoustic impedance layer 4B, the low acoustic impedance layer 420, the high acoustic impedance layer 411, the low acoustic impedance layer 421, the high acoustic impedance layer 412, and the low acoustic impedance layer 422 are arranged in this order from the substrate 2 side. Accordingly, each of the first acoustic impedance layer 4A and the second acoustic impedance layer 4B is capable of reflecting an acoustic wave (plate wave) from the piezoelectric layer 5 at each of a boundary between the low acoustic impedance layer 422 and the high acoustic impedance layer 412, a boundary between the low acoustic impedance layer 421 and the high acoustic impedance layer 411, and a boundary between the high acoustic impedance layer 411 and the low acoustic impedance layer 420.

In each of the first acoustic impedance layer 4A and the second acoustic impedance layer 4B, a material of the plurality of the high acoustic impedance layers 41 is preferably, for example, Pt (platinum). Further, in each of the first acoustic impedance layer 4A and the second acoustic impedance layer 4B, a material of the plurality of the low acoustic impedance layers 42 is preferably, for example, $SiO_2$ (silicon oxide). Each of the first acoustic impedance layer 4A and the second acoustic impedance layer 4B includes two conductive layers because the plurality of the high acoustic impedance layers 41 are each made of Pt.

The plurality of third acoustic impedance layers 40 each reduce or prevent acoustic waves excited at the third interdigital transducer electrode 8 from leaking to the substrate 2. Each of the plurality of the third acoustic impedance layers 40 has the same or similar multilayer structure as those of the first acoustic impedance layer 4A and the second acoustic impedance layer 4B.

The insulation layer 30 is interposed between the substrate 2 and the piezoelectric layer 5 at the position different from the first acoustic impedance 4A, the second acoustic impedance layer 4B, and the plurality of the third acoustic impedance layers 40. In the present preferred embodiment, the insulation layer 30 is in an area other than the first acoustic impedance 4A, the second acoustic impedance layer 4B, and the plurality of the third acoustic impedance layers 40 in the intermediate layer 3 interposed between the substrate 2 and the piezoelectric layer 5. The insulation layer 30 is preferably made of the same material as that of the low acoustic impedance layer 42. The insulation layer 30 has electrical insulating properties.

(2.3) Piezoelectric Layer

The piezoelectric layer 5 is preferably made of, for example, $LiNbO_3$, piezoelectric single crystal.

The thickness of the piezoelectric layer 5 is preferably equal to about 1λ or less, where λ is the wavelength of an acoustic wave determined by 2×T1 (for T1, see FIG. 3A), which is an electrode finger pitch of the first interdigital transducer electrode 7A and the second interdigital transducer electrode 7B and 2×T21 (for T21, see FIG. 3B), which is an electrode finger pitch of the third interdigital transducer electrode 8. In the acoustic wave filter device 1, this enables each of the first interdigital transducer electrode 7A, the second interdigital transducer electrode 7B, and the third interdigital transducer electrode 8 to excite plate waves and enables the plate waves to propagate. With regard to 2×T1 and 2×T21, which are the electrode finger pitches, an explanation is provided in the section "(2.4) First Interdigital Transducer Electrode, Second Interdigital Transducer Electrode, and Third Interdigital Transducer Electrode", which will be described below. For example, in the acoustic wave filter device 1 of the present preferred embodiment, the wavelength of an acoustic wave is preferably about 1.7 μm, and the thickness of the piezoelectric layer 5 is preferably about 340 nm.

(2.4) First Interdigital Transducer Electrode, Second Interdigital Transducer Electrode, and Third Interdigital Transducer Electrode The first interdigital transducer electrode 7A, the second interdigital transducer electrode 7B, and the plurality of the third interdigital transducer electrode 8 are provided on the piezoelectric layer 5. More specifically, the first interdigital transducer 7A, the second interdigital transducer electrode 7B, and the plurality of the third interdigital transducer electrodes 8 are provided on the surface opposite the intermediate layer 3 side of the piezoelectric layer 5. The first interdigital transducer 7A, the second interdigital transducer electrode 7B, and the plurality of the third interdigital transducer electrodes 8 are electrically conductive. Materials of the first interdigital transducer 7A, the second interdigital transducer electrode 7B, and the plurality of the third interdigital transducer electrodes are preferably, for example, Al. Thicknesses of the first interdigital transducer 7A, the second interdigital transducer electrode 7B, and the plurality of the third interdigital transducer electrodes 8 are preferably, for example, about 85 nm.

Figure 3A:
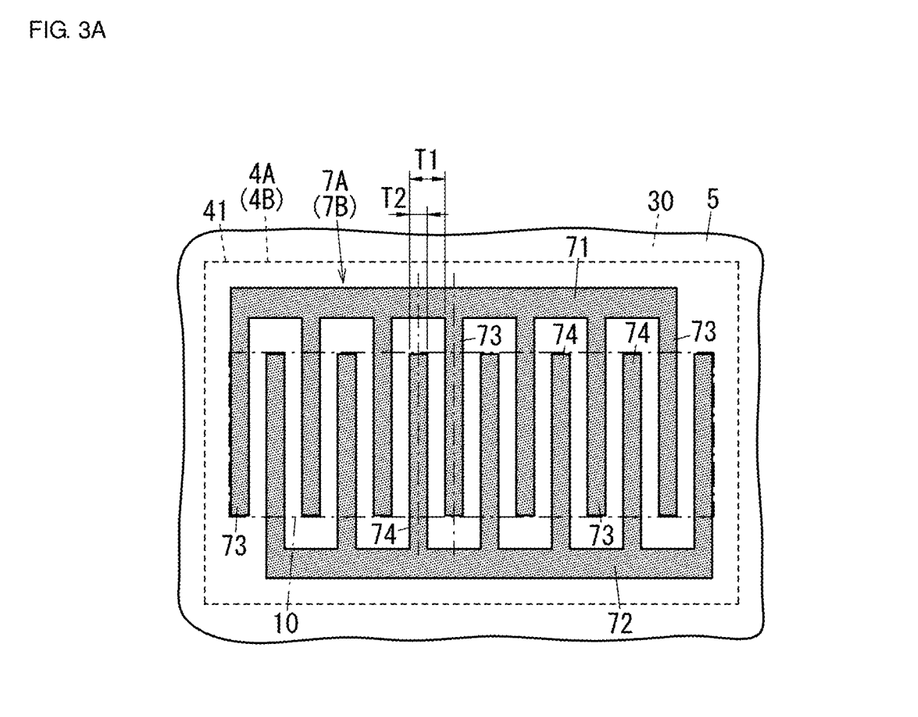
FIG. 3A is a plan view of a first interdigital transducer electrode (or second interdigital transducer electrode) of the acoustic wave filter device according to the preferred embodiment 1 of the present invention.

As illustrated in FIG. 3A, each of the first interdigital transducer electrode 7A and the second interdigital transducer electrode 7B includes a pair of busbars 71 and 72 (hereinafter, also referred to as first busbar 71 and second busbar 72), a plurality of electrode fingers 73 (hereinafter, also referred to as first electrode fingers 73), and a plurality of electrode fingers 74 (hereinafter, also referred to as second electrode fingers 74). In FIG. 3A, dot-hatching is applied on the first interdigital transducer electrode 7A (or the second interdigital transducer electrode 7B). However, this hatching does not represent a cross section but is provided to assist understanding of a relationship between the first interdigital transducer electrode 7A (or the second interdigital transducer electrode 7B) and the first acoustic impedance layer 4A (or the second acoustic impedance layer 4B).

The first busbar 71 and the second busbar 72 have elongated shapes whose lengthwise directions are one direction orthogonal or substantially orthogonal to the thickness direction D1 of the substrate 2. In each of the first interdigital transducer electrode 7A and the second interdigital transducer electrode 7B, the first busbar 71 and the second busbar 72 are disposed opposite each other in a direction orthogonal or substantially orthogonal to both the thickness direction D1 of the substrate 2 and the foregoing one direction.

The plurality of the first electrode fingers 73 are connected to the first busbar 71 and extend toward the second busbar 72. Here, the plurality of the first electrode fingers 73 extend from the first busbar 71 in a direction orthogonal or substantially orthogonal to the lengthwise direction of the first busbar 71. Front edges of the plurality of the first electrode fingers 73 are separated from the second busbar 72. All the plurality of the first electrode fingers 73 have the same or substantially the same length and width.

The plurality of the second electrode fingers 74 are connected to the second busbar 72 and extend toward the first busbar 71. Here, the plurality of the second electrode fingers 74 extend from the second busbar 72 in a direction orthogonal or substantially orthogonal to the lengthwise direction of the second busbar 72. Each of front edges of the plurality of the second electrode fingers 74 is separated from the first busbar 71. The plurality of the second electrode fingers 74 all have the same or substantially the same length and width. The length and width of the plurality of the second electrode fingers 74 are the same or substantially the same as the length and width of the plurality of the first electrode fingers 73, respectively.

In each of the first interdigital transducer electrode 7A and the second interdigital transducer electrode 7B, the plurality of the first electrode fingers 73 and the plurality of the second electrode fingers 74 are arranged side by side in an alternating manner in a direction orthogonal or substantially orthogonal to the direction in which the first busbar 71 and the second busbar 72 face each other. Therefore, in the lengthwise direction of the first busbar 71, the first electrode finger 73 and the second electrode finger 74, which are adjacent to each other, are separated from each other. As illustrated in FIG. 3A, the electrode finger pitch (2×T1) of each of the first interdigital transducer electrode 7A and the second interdigital transducer electrode 7B is twice the value of the distance T1 between corresponding sides (in FIG. 3A, left-hand sides parallel or substantially parallel to respective center lines of the first electrode finger 73 and the second electrode finger 74) of two adjacent electrode fingers, which are the first electrode finger 73 and the second electrode finger 74. The value (duty ratio) obtained by dividing the electrode finger width T2 (see FIG. 3A) by the distance T1 is preferably about 0.5, for example. The electrode finger width T2 is the width of the first electrode finger 73 and the second electrode finger 74.

Each of the first interdigital transducer electrode 7A and the second interdigital transducer electrode 7B excites an acoustic wave (plate wave) in a defined area 10 denoted by the dashed-dotted line in FIG. 3A. The defined area 10 is an area where the plurality of the first electrode fingers 73 and the plurality of the second electrode fingers 74 overlap each other in the direction along the lengthwise direction of the first busbar 71.

Figure 3B:
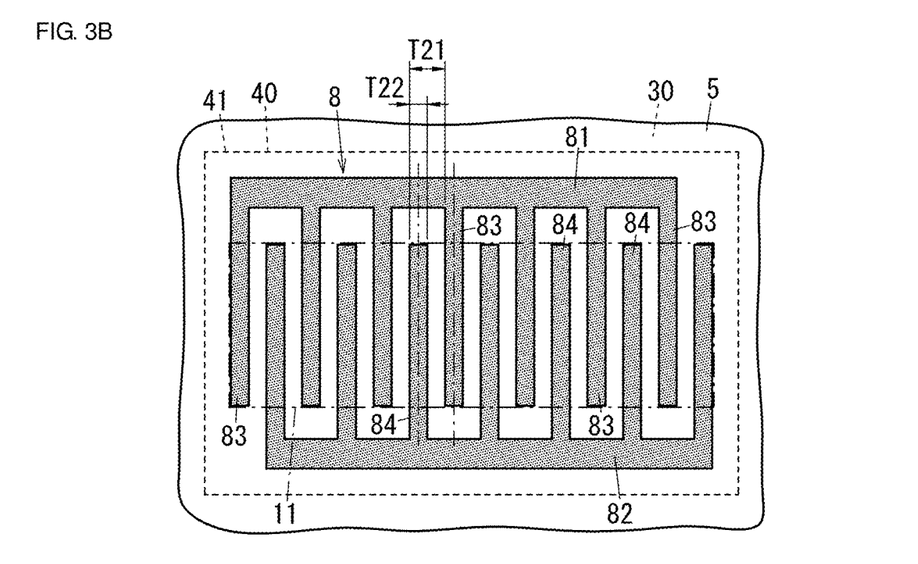
FIG. 3B is a plan view of a third interdigital transducer electrode of the acoustic wave filter device according to the preferred embodiment 1 of the present invention.

As illustrated in FIG. 3B, the third interdigital transducer electrode 8 includes a pair of busbars 81 and 82 (hereinafter, also referred to as first busbar 81 and second busbar 82), a plurality of electrode fingers 83 (hereinafter, also referred to as first electrode fingers 83), and a plurality of electrode fingers 84 (hereinafter, also referred to as second electrode fingers 84). In FIG. 3B, dot-hatching is applied on the third interdigital transducer electrode 8. However, this hatching does not represent a cross section but is provided to assist understanding of a relationship between the third interdigital transducer electrode 8 and the third acoustic impedance layer 40.

The first busbar 81 and the second busbar 82 have elongated shapes whose lengthwise directions are one direction orthogonal or substantially orthogonal to the thickness direction D1 of the substrate 2. In each of the third interdigital transducer electrodes 8, the first busbar 81 and the second busbar 82 are disposed opposite each other in a direction orthogonal or substantially orthogonal to both the thickness direction D1 of the substrate 2 and the foregoing one direction.

The plurality of the first electrode fingers 83 are connected to the first busbar 81 and extend toward the second busbar 82. Here, the plurality of the first electrode fingers 83 extend from the first busbar 81 in a direction orthogonal or substantially orthogonal to the lengthwise direction of the first busbar 81. Front edges of the plurality of the first electrode fingers 83 are separated from the second busbar 82. The plurality of the first electrode fingers 83 all have the same or substantially the same length and width.

The plurality of the second electrode fingers 84 are connected to the second busbar 82 and extend toward the first busbar 81. Here, the plurality of the second electrode fingers 84 extend from the second busbar 82 in a direction orthogonal or substantially orthogonal to the lengthwise direction of the second busbar 82. Each of front edges of the plurality of the second electrode fingers 84 is separated from the first busbar 81. The plurality of the second electrode fingers 84 all have the same or substantially the same length and width. The lengths and widths of the plurality of the second electrode fingers 84 are the same or substantially the same as the lengths and widths of the plurality of the first electrode fingers 83, respectively.

In the third interdigital transducer electrode 8, the plurality of the first electrode fingers 83 and the plurality of the second electrode fingers 84 are arranged side by side in an alternating fashion in a direction orthogonal or substantially orthogonal to the direction in which the first busbar 81 and the second busbar 82 face each other. Therefore, in the lengthwise direction of the first busbar 81, the first electrode finger 83 and the second electrode finger 84, which are adjacent to each other, are separated from each other. As illustrated in FIG. 3B, 2×T21 which is the electrode finger pitch of the third interdigital transducer electrode 8 is twice the value of the distance T21 between corresponding sides (in FIG. 3B, left-hand sides parallel to respective center lines of the first electrode finger 83 and the second electrode finger 84) of two adjacent electrode fingers, which are the first electrode finger 83 and the second electrode finger 84. The value (duty ratio) obtained by dividing the electrode finger width T22 (see FIG. 3B) by the distance T21 is preferably about 0.5, for example. The electrode finger width T22 is the width of the first electrode finger 83 and the second electrode finger 84.

The third interdigital transducer electrode 8 excites an acoustic wave (plate wave) in a defined area 11 denoted by the dashed-dotted line in FIG. 3B. The defined area 11 is an area where the plurality of the first electrode fingers 83 and the plurality of the second electrode fingers 84 overlap each other in the direction along the lengthwise direction of the first busbar 81.

2×T1 which is the electrode finger pitch of the first interdigital transducer electrode 7A and the second interdigital transducer electrode 7B and 2×T21 which is the electrode finger pitch of the third interdigital transducer electrode 8 are the same value.

(3) Layout

In the acoustic wave filter device 1 according to the preferred embodiment 1, the input terminal 15, the output terminal 16, the plurality of ground terminals 17 and 18, the first interdigital transducer electrode 7A, the second interdigital transducer electrode 7B, and the plurality of the third interdigital transducer electrodes 8 are separated from each other on the piezoelectric layer 5.

In the acoustic wave filter device 1 according to the preferred embodiment 1, the first interdigital transducer electrode 7A opposite the first acoustic impedance layer 4A in the thickness direction D1 of the substrate 2 overlaps the high acoustic impedance layer 41 (conductive layer) of the first acoustic impedance layer 4A in the thickness direction D1. Further, in the acoustic wave filter device 1, the entire or substantially the entire area of the first interdigital transducer electrode 7A overlaps the conductive layer opposite the first interdigital transducer electrode 7A. Further, in the acoustic wave filter device 1 according to the preferred embodiment 1, the second interdigital transducer electrode 7B opposite the second acoustic impedance layer 4B in the thickness direction D1 of the substrate 2 overlaps the high acoustic impedance layer 41 (conductive layer) of the second acoustic impedance layer 4B in the thickness direction D1. Further, in the acoustic wave filter device 1, the entire or substantially the entire area of the second interdigital transducer electrode 7B overlaps the conductive layer opposite the second interdigital transducer electrode 7B. The first acoustic impedance layer 4A and the second acoustic impedance layer 4B are arranged so as to be separated from each other. Further, the plurality (for example, two) of the first acoustic impedance layer 4A are separated from each other.

Further, in the acoustic wave filter device 1 according to the preferred embodiment 1, the third interdigital transducer electrode 8 opposite the third acoustic impedance layer 40 in the thickness direction D1 of the substrate 2 overlaps the high acoustic impedance layer 41 (conductive layer) of the third acoustic impedance layer 40 in the thickness direction D1. Further, in the acoustic wave filter device 1, the entire or substantially the entire area of the third interdigital transducer electrode 8 overlaps the conductive layer opposite the third interdigital transducer electrode 8. The plurality of the third acoustic impedance layers 40 are separated from each other.

In the acoustic wave filter device 1 according to the preferred embodiment 1, the intermediate layer 3 is provided of the insulation layer 30 in the area other than the first acoustic impedance layer 4A, the second acoustic impedance layer 4B, and the plurality of the third acoustic impedance layers 40. Therefore, in the acoustic wave filter device 1 according to the preferred embodiment 1, there are two conductive layers (high acoustic impedance layers 411 and 412) in each of the first acoustic impedance layer 4A and the second acoustic impedance layer 4B, and a portion of the insulation layer 30 is interposed between the conductive layers (high acoustic impedance layers 412) that are further away from the substrate 2.

(4) Advantageous Effects

The acoustic wave filter device 1 according to the preferred embodiment 1 includes the substrate 2, the first acoustic impedance layer 4A, the second acoustic impedance layer 4B, the piezoelectric layer 5, the first interdigital transducer electrode 7A, the second interdigital transducer electrode 7B, the input terminal 15, the output terminal 16, the ground terminals 17 and 18, the series arm circuit 12, and the parallel arm circuits 13 and 14. The first acoustic impedance layer 4A and the second acoustic impedance layer 4B are provided on the substrate 2. The piezoelectric layer 5 is provided on the first acoustic impedance layer 4A and the second acoustic impedance layer 4B. The first interdigital transducer electrode 7A is provided on the piezoelectric layer 5 and at least partially overlaps the first acoustic impedance layer 4A in the plan view from the thickness direction D1 of the piezoelectric layer 5. The second interdigital transducer electrode 7B is provided on the piezoelectric layer 5 and at least partially overlaps the second acoustic impedance layer 4B in the plan view from the thickness direction D1. The input terminal 15 is provided on the piezoelectric layer 5. The output terminal 16 is provided on the piezoelectric layer 5. The ground terminals 17 and 18 are provided on the piezoelectric layer 5. The series arm circuit 12 is provided on the first path connecting the input terminal 15 and the output terminal 16 and includes the first interdigital transducer electrode 7A and the second interdigital transducer electrode 7B. The parallel arm circuits 13 and 14 are provided on the second paths connecting nodes on the first path and the ground terminals 17 and 18, respectively. Each of the first acoustic impedance layer 4A and the second acoustic impedance layer 4B includes the high acoustic impedance layer 41 and the low acoustic impedance layer 42 whose acoustic impedance is lower than that of the high acoustic impedance layer 41. In each of the first acoustic impedance layer 4A and the second acoustic impedance layer 4B, the high acoustic impedance layer 41 or the low acoustic impedance layer 42 is a conductive layer.

The conductive layer in the first acoustic impedance layer 4A and the conductive layer in the second acoustic impedance layer 4B are electrically insulated from each other. Note that in the case where the conductive layer opposite the first interdigital transducer electrode 7A in the thickness direction D1 and the conductive layer opposite the second interdigital transducer electrode 7B in the thickness direction D1 are connected to each other, a capacitance is generated due to an unwanted capacitive coupling between the input terminal 15 and the output terminal 16 (in other words, a capacitance due to an unwanted capacitive coupling is connected in parallel to the series arm circuit 12), and an attenuation in the filter characteristic is degraded. Whereas, for example, compared with the case of an acoustic impedance layer 4 including a conductive layer (the high acoustic impedance layer 41) having a size that overlaps the first interdigital transducer electrode 7A and the second interdigital transducer electrode 7B in the thickness direction D1 of the substrate 2 as in an acoustic wave filter device 100 according to a comparison example illustrated in FIG. 5, the acoustic wave filter device 1 according to the preferred embodiment 1 enables the capacitance value of the capacitance produced by the capacitive coupling between the input terminal 15 and the output terminal 16 to be reduced or prevented, and enables a reduction or prevention of degradation of attenuation in the outside of a passband.

Further, in the acoustic wave filter device 1 according to the preferred embodiment 1, the thickness of the piezoelectric layer 5 is preferably equal to about 1λ or less, for example, where λ is the wavelength of an acoustic wave determined by 2×T1, 2×T1, and 2×T21, which are the electrode finger pitches of the first interdigital transducer electrode 7A, the second interdigital transducer electrode 7B, and the third interdigital transducer electrode 8, respectively. This enables the acoustic wave filter device 1 according to the preferred embodiment 1 to excite a plate wave.

Further, in the acoustic wave filter device 1 according to the preferred embodiment 1, the acoustic wave is a plate wave. This enables the acoustic wave filter device 1 according to the preferred embodiment 1 to be used as an acoustic wave filter device that utilizes a plate wave.

Preferred Embodiment 2

An acoustic wave filter device 1a according to a preferred embodiment 2 of the present invention is described with reference to FIG. 6 to FIG. 9. With regard to the acoustic wave filter device 1a according to the preferred embodiment 2, elements the same as or similar to those of the acoustic wave filter device 1 according to the preferred embodiment 1 are denoted by the same reference characters and descriptions thereof are omitted if appropriate.

Figure 9:
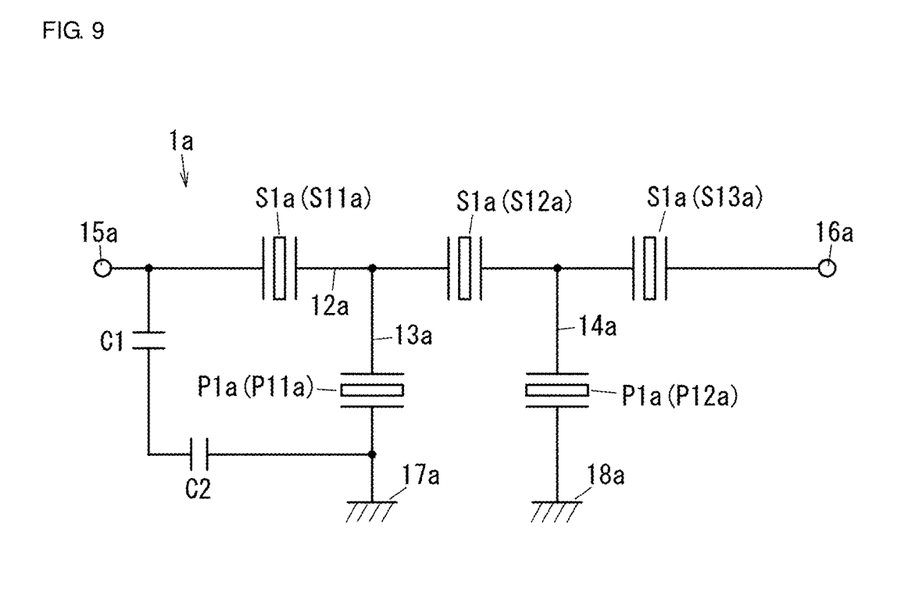
FIG. 9 is a circuit diagram of the acoustic wave filter device according to the preferred embodiment 2 of the present invention.

As illustrated in FIG. 9, the acoustic wave filter device 1a according to the preferred embodiment 2 includes an input terminal 15a, an output terminal 16a, a plurality (for example, two) of ground terminals 17a and 18a, a plurality (for example, three) of series arm resonators S1a, and a plurality (for example, two) of parallel arm resonators P1a. The plurality of the series arm resonators S1a are included in a series arm circuit 12a provided on a first path connecting the input terminal 15a and the output terminal 16a. The plurality of the parallel arm resonators P1a are included in the plurality of parallel arm circuits 13a and 14a provided on the plurality of second paths connecting the two ground terminals 17a and 18a and the nodes on the first path.

In the acoustic wave filter device 1a, the plurality of series arm resonators S1a are connected in series to each other. In the following, for the sake of explanation, the three series arm resonators S1a may also be referred to as a series arm resonator S11a, a series arm resonator S12a, and a series arm resonator S13a from the side closest to the input terminal 15a. Further, the two parallel arm resonators P1a are referred to as a parallel arm resonator P11a and a parallel arm resonator P12a from the side closest to the input arm terminal 15a. One end portion of the parallel arm resonator P11a is connected to a connection point (node on the first path) of two of the series arm resonators S11a and S12a. The other end portion of the parallel arm resonator P11a is connected to the ground terminal 17a. One end portion of the parallel arm resonator P12a is connected to a connection point (node on the first path) of two of the series arm resonators S12a and S13a. The other end portion of the parallel arm resonator P12a is connected to the ground terminal 18a.

Further, in the acoustic wave filter device 1a, a series circuit of a first capacitor C1 and a second capacitor C2 is connected between a connection point of the input terminal 15a and the series arm resonator S11a and a connection of the parallel arm resonator P11a and the ground terminal 17a.

Figure 6:
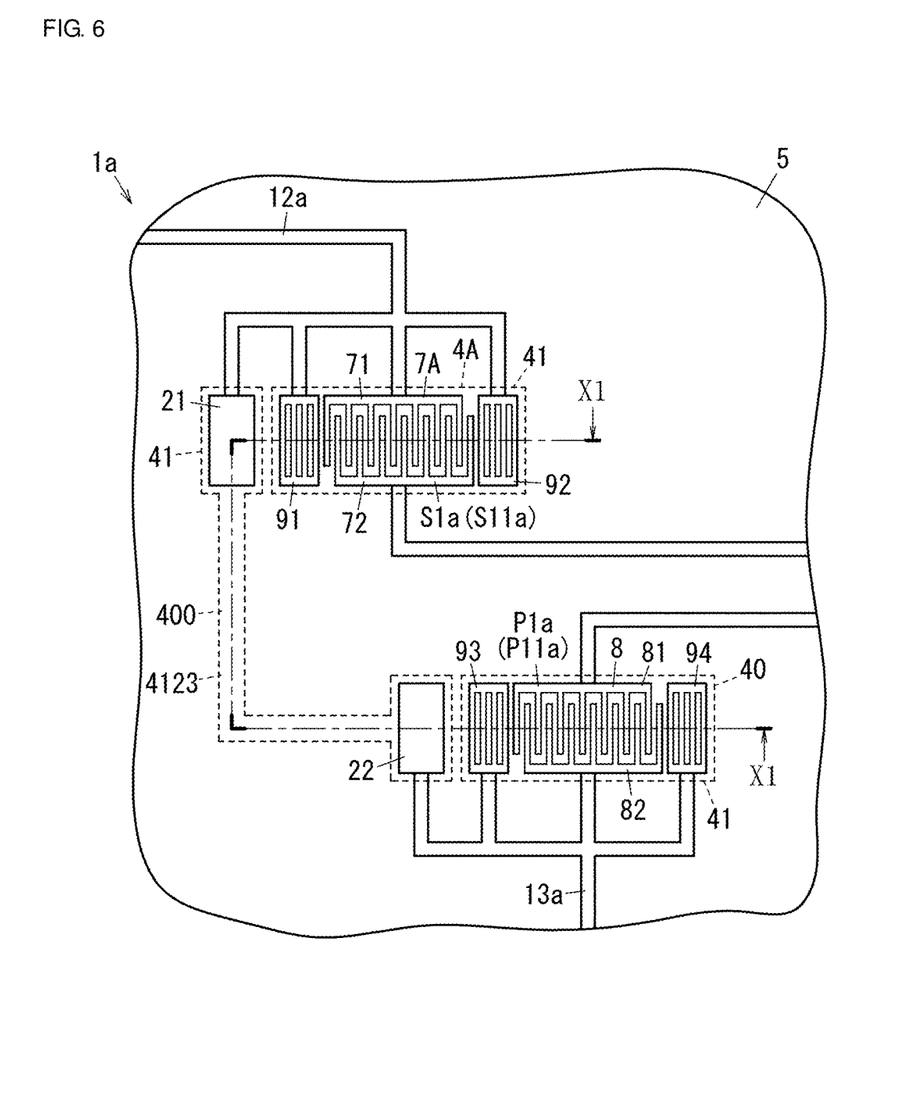
FIG. 6 is a partially-broken plan view of an acoustic wave filter device according to a preferred embodiment 2 of the present invention.
Figure 7:
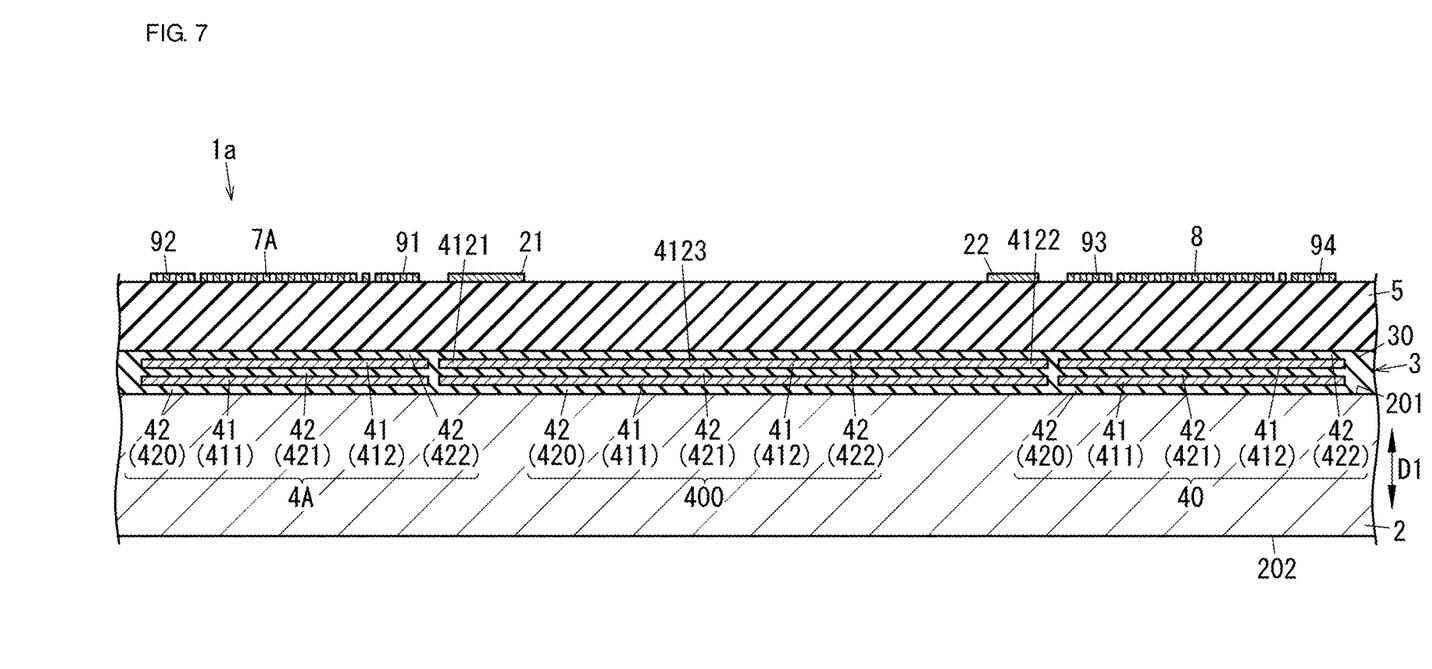
FIG. 7 is a cross-sectional view along the line X1-X1 of FIG. 6.
Figure 8A:
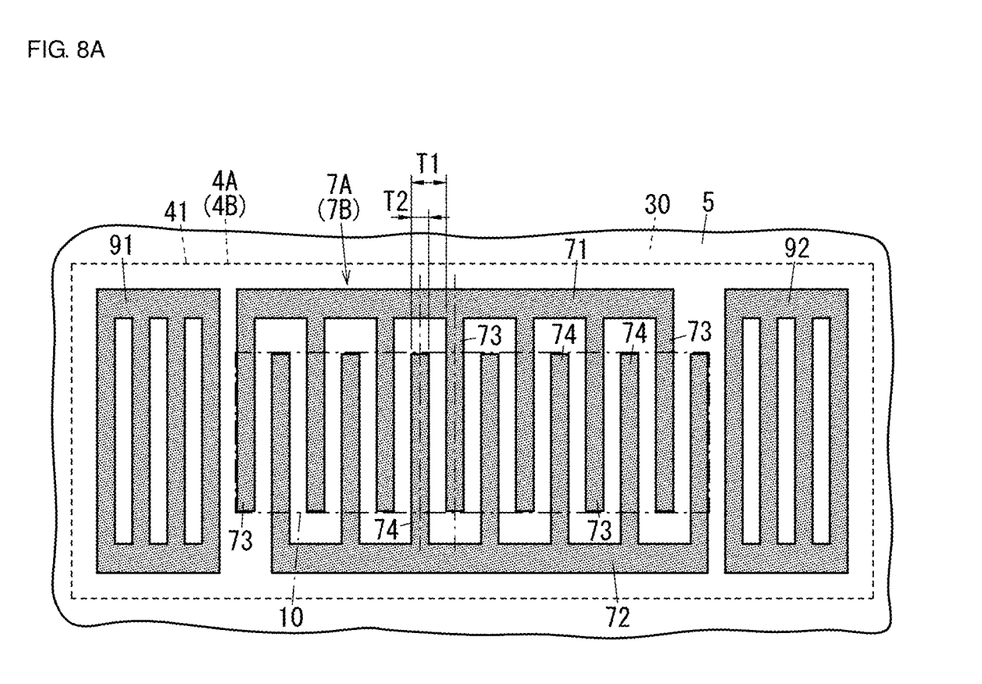
FIG. 8A is a plan view of a first interdigital transducer electrode (or second interdigital transducer electrode) of the acoustic wave filter device and each reflector according to the preferred embodiment 2 of the present invention.
Figure 8B:
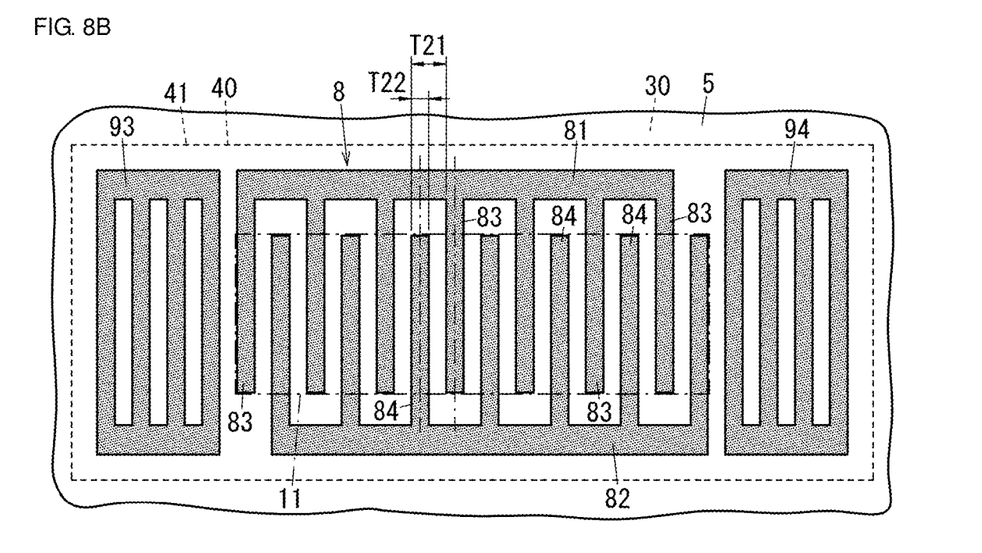
FIG. 8B is a plan view of a third interdigital transducer electrode of the acoustic wave filter device and each reflector according to the preferred embodiment 2 of the present invention.

Further, in the acoustic wave filter device 1a, as illustrated in FIG. 8A, each of the series arm resonators S11a and 13a (see FIG. 9) includes a reflector 91 on the one side of the first interdigital transducer electrode 7A in a direction along the lengthwise direction of the first busbar 71 of the first interdigital transducer electrode 7A and a reflector 92 on the other side thereof. The direction along the lengthwise direction of the first busbar 71 of the first interdigital transducer electrode 7A is a direction along a propagation direction of an acoustic wave (in the present preferred embodiment, a plate wave). The reflectors 91 and 92 are each preferably, for example, a grating reflector. The reflectors 91 and 92 reflect acoustic waves. In FIG. 8A, dot-hatching is applied on the first interdigital transducer electrode 7A and the reflectors 91 and 92. However, this hatching does not represent a cross section but is provided to assist understanding of a relationship between the first interdigital transducer electrode 7A and the reflectors 91 and 92 and the first acoustic impedance layer 4A. In the acoustic wave filter device 1a, the first acoustic impedance layer 4A overlaps, in the thickness direction D1, not only the first interdigital transducer electrode 7A but also the reflectors 91 and 92 on both sides of the first interdigital transducer electrode 7A. Further, in the acoustic wave filter device 1a, as illustrated in FIG. 8A, the series arm resonator S12a (see FIG. 9) includes the reflector 91 on the one side of the second interdigital transducer electrode 7B in a direction along the lengthwise direction of the first busbar 71 of the second interdigital transducer electrode 7B and the reflector 92 on the other side thereof. The direction along the lengthwise direction of the first busbar 71 of the second interdigital transducer electrode 7B is a direction along a propagation direction of an acoustic wave (in the present preferred embodiment, a plate wave). The reflectors 91 and 92 on the both sides of the second interdigital transducer electrode 7B are each preferably, for example, a grating reflector and reflect an acoustic wave. In FIG. 8A, dot-hatching is applied on the second interdigital transducer electrode 7B and the reflectors 91 and 92. However, this hatching does not represent a cross section but is provided to assist understanding of a relationship between the second interdigital transducer electrode 7B and the reflectors 91 and 92 and the second acoustic impedance layer 4B. In the acoustic wave filter device 1a, the second acoustic impedance layer 4B overlaps, in the thickness direction D1, not only the second interdigital transducer electrode 7B but also the reflectors 91 and 92 on both sides of the second interdigital transducer electrode 7B. Further, in the acoustic wave filter device 1a, as illustrated in FIG. 8B, each of the plurality of parallel arm resonators P1a includes a reflector 93 on the one side of the third interdigital transducer electrode 8 in a direction along the lengthwise direction of the first busbar 81 of the third interdigital transducer electrode 8 and a reflector 94 on the other side thereof. The direction along the lengthwise direction of the first busbar 81 of the third interdigital transducer electrode 8 is a direction along a propagation direction of an acoustic wave (in the present preferred embodiment, a plate wave). The reflectors 93 and 94 are each preferably, for example, a grating reflector. The reflectors 93 and 94 each reflect an acoustic wave. In FIG. 8B, dot-hatching is applied on the third interdigital transducer electrode 8 and the reflectors 93 and 94. However, this hatching does not represent a cross section but is provided to assist understanding of a relationship between the third interdigital transducer electrode 8 and the reflectors 93 and 94 and the third acoustic impedance layer 40. In the acoustic wave filter device 1a, the third acoustic impedance layer 40 overlaps, in the thickness direction D1, not only the third interdigital transducer electrode 8 but also the reflectors 93 and 94 on both sides of the third interdigital transducer electrode 8. As illustrated in FIG. 6 and FIG. 7, the acoustic wave filter device 1a further includes a first electrode 21 and a second electrode 22.

The first electrode 21 defines the first capacitor C1 and is provided on the piezoelectric layer 5. The first electrode 21 is electrically connected to the busbar 71 on the input terminal 15a side of a pair of the busbars 71 and 72 of the first interdigital transducer electrode 7A, which is one of a plurality of the first interdigital transducer electrodes 7A and the second interdigital transducer electrode 7B. As illustrated in FIG. 6, the first electrode 21 is adjacent to the series arm resonator S11a in the plan view from the thickness direction D1 (see FIG. 7) of the substrate 2. The first electrode 21, with the busbar 71 of the first interdigital transducer electrode 7A of the series arm resonator S11a, is connected to a portion of the series arm circuit 12a where they have the same potential.

The second electrode 22 defines the second capacitor C2 and is provided on the piezoelectric layer 5. The second electrode is electrically connected to the busbar 82 on the ground terminal 17a side of a pair of the busbars 81 and 82 of the third interdigital transducer electrode 8, which is one of the plurality of the third interdigital transducer electrodes 8. As illustrated in FIG. 6, the second electrode 22 is adjacent to the parallel arm resonator P11a in the plan view from the thickness direction D1 of the substrate 2. The second electrode 22, with the parallel arm resonator P11a, is connected to a portion of the parallel arm circuit 13a where they have the same potential.

In the acoustic wave filter device 1a, the intermediate layer 3 further includes an acoustic impedance layer 400 (hereinafter, also referred to as fourth acoustic impedance layer 400). The fourth acoustic impedance layer 400 is interposed between the substrate 2 and the piezoelectric layer 5 in the thickness direction D1 of the substrate 2. The fourth acoustic impedance layer 400 overlaps at least partially the first electrode 21 and at least partially the second electrode 22 in the plan view from the thickness direction D1. The fourth acoustic impedance layer 400 has the same or similar multilayer structure as those of the first acoustic impedance layer 4A, the second acoustic impedance layer 4B, and the third acoustic impedance layer 40. Accordingly, the fourth acoustic impedance layer 400 includes at least one layer (two layers in the preferred embodiment 2) of the conductive layers (high acoustic impedance layers 411 and 412). In the acoustic wave filter device 1a, the first capacitor C1 is defined by the first electrode 21, a first portion 4121, and a portion of the piezoelectric layer 5, the first portion 4121 being of the high acoustic impedance layer 412 of the fourth acoustic impedance layer 400 and being opposite the first electrode 21, the portion of the piezoelectric layer 5 being interposed between the first electrode 21 and the first portion 4121 of the high acoustic impedance layer 412. Further, in the acoustic wave filter device 1a, the second capacitor C2 is defined by the second electrode 22, a second portion 4122, and a portion of the piezoelectric layer 5, the second portion 4122 being of the high acoustic impedance layer 412 of the fourth acoustic impedance layer 400 and being opposite the second electrode 22, the portion of the piezoelectric layer 5 being interposed between the second electrode 22 and the second part 4122 of the high acoustic impedance layer 412. Further, a third portion 4123 of the high acoustic impedance layer 412 of the fourth acoustic impedance layer 400, which is between the first portion 4121 and the second portion 4122, defines a wiring that electrically connects the first capacitor C1 and the second capacitor C2.

In the acoustic wave filter device 1a according to the preferred embodiment 2, the first capacitor C1 and the second capacitor C2 are provided by including the first electrode 21, the second electrode 22, and the fourth acoustic impedance layer 400. This enables further reduction or prevention of degradation of the filter characteristic (degradation of attenuation). Further, in the acoustic wave filter device 1a according to the preferred embodiment 2, the capacitance values of the first capacitor C1 and the second capacitor C2 can be determined at the time of designing by determining the respective areas of the first electrode 21 and the second electrode 22 (respective areas facing the conductive layer of the fourth acoustic impedance layer 400).

Further, in the acoustic wave filter device 1a according to the preferred embodiment 2, the wiring is defined by the third portion 4123 of the fourth acoustic impedance layer 400. Thus, compared with the case where the wiring is provided on the piezoelectric layer 5, downsizing can be achieved.

The foregoing preferred embodiments 1 and 2 are ones of various preferred embodiments of the present invention. The foregoing preferred embodiments 1 and 2 may be modified in various ways according to the design and the like, provided that the advantageous effects and benefits of the present invention are achieved.

For example, in the acoustic wave filter device 1, the plurality of the ground terminals 17 and 18 are included, and the plurality of the ground terminals 17 and 18 are connected to the plurality of the parallel arm resonators P1 in one-to-one manner. However, the configuration is not limited thereto, and a plurality of the parallel arm resonators P1 may be connected to a single ground terminal. That is to say, the ground terminals 17 and 18 may be provided as a single common ground terminal. Similarly, with regard to the acoustic wave filter device 1a, the ground terminals 17a and 18a may be provided as a single common ground terminal.

Further, the material of the substrate 2 is not limited to Si and may also be, for example, $LiNbO_3$, $LiTaO_3$, crystal, glass, or the like. Further, in plan view, the substrate 2 viewed from the thickness direction D1 of the substrate 2 is not limited to a rectangular or substantially rectangular shape and may also be, for example, a square or substantially square shape.

Further, the number of the high acoustic impedance layer 41 and the number of the low acoustic impedance layer 42 in each of the first acoustic impedance layer 4A and the second acoustic impedance layer 4B are not limited to two and three and may alternatively be equal to or more than three and four, respectively. Further, the number of the high acoustic impedance layer 41 is not necessarily different from the number of the low acoustic impedance layer 42. Alternatively, the number of the high acoustic impedance layer 41 may be equal to the number of the low acoustic impedance layer 42, or the number of the low acoustic impedance layer 42 may be one less than the number of the high acoustic impedance layer 41. Further, with regard to each of the first acoustic impedance layer 4A and the second acoustic impedance layer 4B, it is only necessary to include at least one high acoustic impedance layer 41 and at least one low acoustic impedance layer 42 that overlap each other in the thickness direction D1 of the substrate 2. Further, the material of the plurality of the high acoustic impedance layers 41 is not limited to Pt (platinum) and may be, for example, a metal such as W (tungsten) or the like. Further, each of the first acoustic impedance layer 4A and the second acoustic impedance layer 4B is not limited to the example where the high acoustic impedance layer 41 is the conductive layer, and alternatively, the low acoustic impedance layer 42 may be a conductive layer. In either case, it is only necessary that the conductive layer in the first acoustic impedance layer 4A is electrically insulated from the conductive layer in the second acoustic impedance layer 4B. Further, in the case where a plurality of the first acoustic impedance layers 4A are included as in the acoustic wave filter device 1, it is only necessary that conductive layers of the plurality of the first acoustic impedance layers 4A are electrically insulated from each other. Similarly, as is the case with the first acoustic impedance layer 4A and the second acoustic impedance layer 4B, the third acoustic impedance layer 40a and the fourth acoustic impedance layer 400 of the acoustic wave filter device 1a according to the preferred embodiment 2 are not limited to the example where the high acoustic impedance layer 41 is the conductive layer, and alternatively the low acoustic impedance layer 42 may be a conductive layer.

Further, the plurality of the high acoustic impedance layers 41 is not necessarily made of the same material and may be, for example, made of different materials. Further, the plurality of the low acoustic impedance layers 42 is not necessarily made of the same material and may be, for example, made of different materials.

The material of the piezoelectric layer 5 is not limited to LiNbO$_3$ and may also be, for example, LiTaO$_3$ or the like.

Materials of the first interdigital transducer electrode 7A, the second interdigital transducer electrode 7B, the third interdigital transducer electrode 8, and the reflectors 91, 92, 93, and 94 are not limited to Al and may also be Al alloy, for example. Further, the materials of the first interdigital transducer electrode 7A, the second interdigital transducer electrode 7B, the third interdigital transducer electrode 8, and the reflectors 91, 92, 93, and 94 may also be, for example, Cu, Pt, Au, Ag, Ti, Ni, Cr, Mo, W, an alloy whose main component is one of these metals, or the like. Further, structures of first interdigital transducer electrode 7A, the second interdigital transducer electrode 7B, the third interdigital transducer electrode 8, and the reflectors 91, 92, 93, and 94 are not limited to a single layer structure and may alternatively be a multilayer structure.

In the acoustic wave filter devices 1 and 1a, the entire or substantially the entire area of the first interdigital transducer electrode 7A overlaps the conductive layer (high acoustic impedance layer 41) of the first acoustic impedance layer 4A in the plan view from the thickness direction D1. However, the configuration is not limited thereto, and only a portion of the first interdigital transducer electrode 7A (for example, the defined area 10) may overlap the conductive layer in the plan view from the thickness direction D1. Further, in the acoustic wave filter devices 1 and 1a, the entire or substantially the entire area of the second interdigital transducer electrode 7B overlaps the conductive layer (high acoustic impedance layer 41) of the second acoustic impedance layer 4B in the plan view from the thickness direction D1. However, the configuration is not limited thereto, and only a portion of the second interdigital transducer electrode 7B (for example, the defined area 10) may overlap the conductive layer in the plan view from the thickness direction D1.

Further, in the acoustic wave filter device 1a, one end portion of the second capacitor C2 on the side opposite to the first capacitor C1 is connected to a connection point of the ground terminal 17a and (the second busbar 82 of the third interdigital transducer electrode 8 of) the parallel arm resonator P11a. However, the configuration is not limited thereto. For example, the one end portion of the second capacitor C2 on the side opposite to the first capacitor C1 may be connected to a connection point of the ground terminal 18a and (the second busbar 82 of the third interdigital transducer electrode 8 of) the parallel arm resonator P12a.

Further, in the acoustic wave filter device 1a, the fourth acoustic impedance layer 400 is separated from each of the first acoustic impedance layer 4A of the series arm resonator S11a and the third acoustic impedance layer 40 of the parallel arm resonator P11a. However, the configuration is not limited thereto. In the acoustic wave filter device 1a, for example, in the case where the capacitance value of the series circuit of the first capacitor C1 and the second capacitor C2 needs to be increased, the fourth acoustic impedance layer 400 may be connected to one or both of the first acoustic impedance layer 4A of the series arm resonator S11a and the third acoustic impedance layer of the parallel arm resonator P11a.

Further, in the acoustic wave filter device 1, the two parallel arm circuits 13 and 14 are included. However, the number of the parallel arm circuits is not limited to two and may be, for example, one or three or more. Similarly, in the acoustic wave filter device 1a, the number of the parallel arm circuits is not limited to two and may be, for example, one or three or more. Further, the configuration of the parallel arm circuit is not limited to the configuration including a parallel arm resonator and may be, for example, a configuration including an inductor, a capacitor, and the like.

An acoustic wave filter device (1; 1a) according to a preferred embodiment of the present invention includes a substrate (2), a first acoustic impedance layer (4A), a second acoustic impedance layer (4B), a piezoelectric layer (5), a first interdigital transducer electrode (7A), a second interdigital transducer electrode (7B), an input terminal (15; 15a), an output terminal (16; 16a), ground terminals (17, 18; 17a, 18a), a series arm circuit (12; 12a), and parallel arm circuits (13, 14; 13a, 14a). The first acoustic impedance layer (4A) and the second acoustic impedance layer (4B) are provided on the substrate (2). The piezoelectric layer (5) is provided on the first acoustic impedance layer (4A) and the second acoustic impedance layer (4B). The first interdigital transducer electrode (7A) is provided on the piezoelectric layer (5) and at least partially overlaps the first acoustic impedance layer (4A) in the plan view from the thickness direction D1 of the piezoelectric layer (5). The second interdigital transducer electrode (7B) is provided on the piezoelectric layer (5) and at least partially overlaps the second acoustic impedance layer (4B) in the plan view from the thickness direction D1. The input terminal (15; 15a) is provided on the piezoelectric layer (5). The output terminal (16; 16a) is provided on the piezoelectric layer (5). The ground terminals (17, 18; 17a, 18a) are provided on the piezoelectric layer (5). The series arm circuit (12; 12a) is provided on a first path connecting the input terminal (15; 15a) and the output terminal (16; 16a) and includes the first interdigital transducer electrode (7A) and the second interdigital transducer electrode (7B). The parallel arm circuits (13, 14; 13a, 14a) are provided on second paths connecting nodes on the first path and the ground terminals (17, 18; 17a, 18a), respectively. Each of the first acoustic impedance layer (4A) and the second acoustic impedance layer (4B) includes at least one high acoustic impedance layer (41) and at least one low acoustic impedance layer (42) whose acoustic impedance is lower than that of the at least one high acoustic impedance layer (41). In each of the first acoustic impedance layer (4A) and the second acoustic impedance layer (4B), at least one of the at least one high acoustic impedance layer (41) and the at least one low acoustic impedance layer (42) is a conductive layer. The conductive layer in the first acoustic impedance layer (4A) and the conductive layer in the second acoustic impedance layer (4B) are electrically insulated from each other.

The acoustic wave filter device (1; 1a) according to the above-described preferred embodiment reduces or prevents degradation of attenuation.

In an acoustic wave filter device (1; 1a) according to a preferred embodiment of the present invention, the at least one high acoustic impedance layer (41) includes a plurality of high acoustic impedance layer (41). The at least one low acoustic impedance layer (42) includes a plurality of low acoustic impedance layers (42). The plurality of high acoustic impedance layers (41) and the plurality of the low acoustic impedance layers (42) are arranged layer by layer in an alternating fashion in the thickness direction (D1).

The acoustic wave filter device (1; 1a) according to the above-described preferred embodiment improves the filter characteristic.

In an acoustic wave filter device (1a) according to a preferred embodiment of the present invention, the parallel arm circuits (13, 14; 13a, 14a) include a third interdigital transducer electrode (8) provided on the piezoelectric layer (5). Each of the first interdigital transducer electrode (7A), the second interdigital transducer electrode 7B, and the third interdigital transducer electrode (8) includes a pair of busbars (71, 72, 71, 72, and 81, 82). The acoustic wave filter device (1a) further includes a first electrode (21) and a second electrode (22). The first electrode (21) is provided on the piezoelectric layer (5). The first electrode (21) is electrically connected to the busbar (71) on the input terminal (15a) side of the pair of the busbars (71, 72) of one of the first interdigital transducer electrode (7A) and the second interdigital transducer electrode (7B). The second electrode (22) is provided on the piezoelectric layer (5). The second electrode (22) is electrically connected to the busbar (82) on the ground terminal (17a) side of the pair of busbars (81, 82) of the third interdigital transducer electrode (8), which is one of the plurality of the third interdigital transducer electrodes (8). The acoustic wave filter device (1a) further includes an acoustic impedance layer (400). The acoustic impedance layer (400) includes at least one layer of conductive layer that overlaps at least partially the first electrode (21) and at least partially the second electrode (22) in the plan view in between the substrate (2) and the piezoelectric layer (5).

The acoustic wave filter device (1a) according to the above-described preferred embodiment further reduces or prevents degradation of attenuation.

In an acoustic wave filter device (1; 1a) according to a preferred embodiment of the present invention, the thickness of the piezoelectric layer (5) in the third aspect is about $1\lambda$ or less, where $\lambda$ is the wavelength of an acoustic wave determined by electrode finger pitches ($2 \times T1$, $2 \times T1$, and $2 \times T21$) of the first interdigital transducer electrode (7A), the second interdigital transducer electrode (7B), and the third interdigital transducer electrode (8).

The acoustic wave filter device (1; 1a) according to the above-described preferred embodiment excites a plate wave.

In an acoustic wave filter device (1; 1a) according to a preferred embodiment of the present invention, an acoustic wave is a plate wave.

The acoustic wave filter device (1; 1a) according to the above-described preferred embodiment is able to be used as an acoustic wave filter device utilizing a plate wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
a substrate;
a first acoustic impedance layer and a second acoustic impedance layer on the substrate;
a piezoelectric layer on the first acoustic impedance layer and the second acoustic impedance layer;
a first interdigital transducer electrode on the piezoelectric layer, the first interdigital transducer electrode overlapping at least partially the first acoustic impedance layer in a plan view from a thickness direction of the piezoelectric layer;
a second interdigital transducer electrode on the piezoelectric layer, the second interdigital transducer electrode overlapping at least partially the second acoustic impedance layer in the plan view from the thickness direction;
an input terminal on the piezoelectric layer;
an output terminal on the piezoelectric layer;
a ground terminal on the piezoelectric layer;
a series arm circuit on a first path connecting the input terminal and the output terminal, the series arm circuit including the first interdigital transducer electrode and the second interdigital transducer electrode;
a parallel arm circuit on a second path connecting a node on the first path and the ground terminal;
a first electrode;
a second electrode; and
a third acoustic impedance layer; wherein
each of the first acoustic impedance layer and the second acoustic impedance layer includes:
at least one high acoustic impedance layer; and
at least one low acoustic impedance layer whose acoustic impedance is lower than that of the at least one high acoustic impedance layer;
in each of the first acoustic impedance layer and the second acoustic impedance layer, at least one of the high acoustic impedance layer and the low acoustic impedance layer is a conductive layer;

the conductive layer in the first acoustic impedance layer and the conductive layer in the second acoustic impedance layer are electrically insulated from each other;

the parallel arm circuit includes a plurality of third interdigital transducer electrodes provided on the piezoelectric layer;

each of the first interdigital transducer electrode, the second interdigital transducer electrode, and the plurality of the third interdigital transducer electrodes includes a pair of busbars;

the first electrode is provided on the piezoelectric layer and electrically connected to one of the pair of busbars on an input terminal side, the one of the pair of busbars being included in one of the first interdigital transducer electrode and the second interdigital transducer electrode;

the second electrode is provided on the piezoelectric layer and electrically connected to one of the pair of busbars on a ground terminal side, the one of the pair of busbars being included in one of the plurality of third interdigital transducer electrodes; and the third acoustic impedance layer includes at least one conductive layer that overlaps at least a portion of the first electrode and at least a portion of the second electrode in a plan view in between the substrate and the piezoelectric layer.

2. The acoustic wave filter device according to claim 1, wherein a thickness of the piezoelectric layer is about 1λ or less where λ is a wavelength of an acoustic wave determined by electrode finger pitches of the first interdigital transducer electrode, the second interdigital transducer electrode, and the plurality of third interdigital transducer electrodes.

3. The acoustic wave filter device according to claim 2, wherein the acoustic wave is a plate wave.

4. The acoustic wave filter device according to claim 1, wherein
the at least one high acoustic impedance layer includes a plurality of the high acoustic impedance layers;
the at least one low acoustic impedance layer includes a plurality of the low acoustic impedance layers; and
the plurality of high acoustic impedance layers and the plurality of the low acoustic impedance layers alternate in the thickness direction.

5. The acoustic wave filter device according to claim 1, wherein the substrate is made of silicon.

6. The acoustic wave filter device according to claim 1, wherein a thickness of the substrate is about 120 μm.

7. The acoustic wave filter device according to claim 1, wherein the at least one high impedance layer is made of Pt.

8. The acoustic wave filter device according to claim 1, wherein the at least one low impedance layer is made of $SiO_2$.

9. The acoustic wave filter device according to claim 1, wherein the piezoelectric layer is made of $LiNbO_3$.

10. The acoustic wave filter device according to claim 1, wherein a thickness of the piezoelectric layer is about 340 nm.

11. The acoustic wave filter device according to claim 1, wherein each of the first and second interdigital transducer electrodes is made of Al.

12. The acoustic wave filter device according to claim 1, wherein a thickness of each of the first and second interdigital transducer electrodes is about 85 nm.

13. The acoustic wave filter device according to claim 1, wherein
an insulation layer is interposed between the substrate and the piezoelectric layer at a position different from the first acoustic impedance layer and the second impedance layer;
the insulation layer is made of a same material as a material from which the low acoustic impedance layer is made; and
in a direction along the thickness direction of the piezoelectric layer, a thickness of the insulation layer is the same or substantially the same as a thickness of at least one of the first acoustic impedance layer and the second acoustic impedance layer.

* * * * *